(12) United States Patent
Yoon et al.

(10) Patent No.: US 7,659,051 B2
(45) Date of Patent: Feb. 9, 2010

(54) POLYMER HAVING ANTIREFLECTIVE PROPERTIES, HARDMASK COMPOSITION INCLUDING THE SAME, AND PROCESS FOR FORMING A PATTERNED MATERIAL LAYER

(75) Inventors: Kyong Ho Yoon, Daejeon Kwangyeok-si (KR); Jong Seob Kim, Daejeon Kwangyeok-si (KR); Dong Seon Uh, Seoul (KR); Chang Il Oh, Seongnam-si (KR); Kyung Hee Hyung, Sungnam-si (KR); Min Soo Kim, Kwangyeok-si (KR); Jin Kuk Lee, Gunpo-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 208 days.

(21) Appl. No.: 12/003,731

(22) Filed: Dec. 31, 2007

(65) Prior Publication Data
US 2008/0160460 A1     Jul. 3, 2008

(30) Foreign Application Priority Data
Dec. 29, 2006    (KR) .................. 10-2006-0138418

(51) Int. Cl.
*G03F 7/004*     (2006.01)
*G03F 7/11*     (2006.01)
*C08G 61/00*     (2006.01)
*C08G 10/00*     (2006.01)

(52) U.S. Cl. ................... 430/313; 430/317; 430/323; 430/272.1; 430/271.1; 525/398; 525/402; 528/151; 528/152; 528/153

(58) Field of Classification Search ................... None
See application file for complete search history.

(56) References Cited

U.S. PATENT DOCUMENTS

2004/0241338 A1 * 12/2004 Foster et al. ................ 427/487
2006/0251990 A1 * 11/2006 Uh et al. ................. 430/270.1

\* cited by examiner

*Primary Examiner*—Cynthia Hamilton
(74) *Attorney, Agent, or Firm*—Lee & Morse, P.C.

(57) ABSTRACT

A naphthalene-backbone polymer represented by Formula 1:

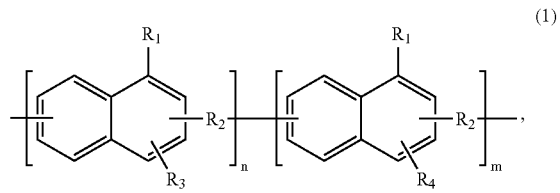

wherein n and m are independently at least 1 and less than about 190, $R_1$ is a hydrogen, a hydroxyl, a hydrocarbon group of about 10 carbons or less, or a halogen, $R_2$ is methylene or includes an aryl linking group, $R_3$ is a conjugated diene group, and $R_4$ is an unsaturated dienophile group.

24 Claims, 2 Drawing Sheets

POLYMER HAVING ANTIREFLECTIVE PROPERTIES, HARDMASK COMPOSITION INCLUDING THE SAME, AND PROCESS FOR FORMING A PATTERNED MATERIAL LAYER

BACKGROUND OF THE INVENTION

1. Field of the Invention

Embodiments relate to a polymer having antireflective properties, a hardmask composition including the same, and a process for forming a patterned material layer.

2. Description of the Related Art

Antireflective coating (ARC) materials may be incorporated in an imaging layer used during a lithographic process, in order to minimize reflectivity between the imaging layer and a target material layer during fabrication of a device. However, where the imaging layer incorporating ARC materials and the target material layer have similar compositions, the imaging layer may exhibit poor etch selectivity, such that portions of the imaging layer may be consumed during etching of the target material layer. Accordingly, a hardmask may be included as an intermediate layer, the hardmask being disposed between the imaging layer and the target material layer. The hardmask may receive a pattern from the overlying imaging layer, and may be used to transfer the pattern to the underlying material layer. However, there is a need for hardmask materials that exhibit antireflective properties.

SUMMARY OF THE INVENTION

Embodiments are therefore directed to a polymer having antireflective properties, a hardmask composition including the same, and a process for forming a patterned material layer, which substantially overcome one or more of the problems due to the limitations and disadvantages of the related art.

It is therefore a feature of an embodiment to provide a polymer having aromatic ring-containing groups in the backbone.

It is therefore another feature of an embodiment to provide an antireflective hardmask composition including the polymer.

It is therefore another feature of an embodiment to provide a process of fabricating a device using an antireflective hardmask composition.

At least one of the above and other features and advantages may be realized by providing a naphthalene-backbone polymer represented by Formula 1:

(1)

In Formula 1, n and m may independently be at least 1 and less than about 190, $R_1$ may be a hydrogen, a hydroxyl, a hydrocarbon group of about 10 carbons or less, or a halogen, $R_2$ may be methylene or may include an aryl linking group, $R_3$ may be a conjugated diene group, and $R_4$ may be an unsaturated dienophile group.

$R_1$ may be the hydrocarbon of about 10 carbons or less, and the hydrocarbon of about 10 carbons or less may include a $C_1$-$C_{10}$ alkyl group, a $C_6$-$C_{10}$ aryl group, or an allyl group. $R_2$ may be:

$R_2$ may be unsubstituted or substituted. $R_3$ may be a 1,3-butadienyl group, a furanyl group, a cyclopentadienyl group, a cyclopentadienylmethyl group, a 1,6-cyclohexadienyl group, or a 1,6-cyclohexadienylmethyl group. $R_4$ may be a vinyl group, a cyclopentenyl group, a cyclopentenylmethyl group, a cyclohexenyl group, or a cyclohexenylmethyl group. The polymer may have a weight average molecular weight of about 1,000 to about 30,000.

The polymer may further include a hydroxynaphthalene group in the backbone, the polymer being represented by Formula 2:

(2)

In Formula 2, l may be at least 1 and less than about 190. In Formula 2, the ratio l:n+m may be about 1:2 to about 4:2. The polymer may have a weight average molecular weight of about 1,000 to about 30,000.

At least one of the above and other features and advantages may also be realized by providing an antireflective hardmask composition, including an organic solvent and a naphthalene-backbone polymer represented by Formula 1:

(1)

In Formula 1, n and m may independently be at least 1 and less than about 190, $R_1$ may be a hydrogen, a hydroxyl, a hydrocarbon group of about 10 carbons or less, or a halogen, $R_2$ may be methylene or may include an aryl linking group, $R_3$ may be a conjugated diene group, and $R_4$ may be an unsaturated dienophile group.

About 1% to about 25% of the weight of the composition may be the polymer represented by Formula 1, and about 75% to 99% of the weight of the composition may be the organic solvent. $R_1$ may be the hydrocarbon of about 10 carbons or less, and the hydrocarbon of about 10 carbons or less may include a $C_1$-$C_{10}$ alkyl group, a $C_6$-$C_{10}$ aryl group, or an allyl group. $R_2$ may be:

-continued

, and

$R_2$ may be unsubstituted or substituted. $R_3$ may be a 1,3-butadienyl group, a furanyl group, a cyclopentadienyl group, a cyclopentadienylmethyl group, a 1,6-cyclohexadienyl group, or a 1,6-cyclohexadienylmethyl group. $R_4$ may be a vinyl group, a cyclopentenyl group, a cyclopentenylmethyl group, a cyclohexenyl group, or a cyclohexenylmethyl group. The polymer represented by Formula 1 may have a weight average molecular weight of about 1,000 to about 30,000.

The naphthalene-backbone polymer may further include a hydroxynaphthalene group in the backbone, such that the naphthalene-backbone polymer is represented by Formula 2:

(2)

In Formula 2, l may be at least 1 and less than about 190. In Formula 2, the ratio l:n+m may be about 1:2 to about 4:2. The composition may further include a crosslinker.

At least one of the above and other features and advantages may also be realized by providing an antireflective hardmask composition, including an organic solvent, a first naphthalene-backbone polymer represented by Formula 3:

(3)

a second naphthalene-backbone polymer represented by Formula 4:

(4)

In Formulae 3 and 4, n, m, n' and m' may independently be at least 1 and less than about 190, $R_1$ and $R_1'$ may independently be a hydrogen, a hydroxyl, a hydrocarbon group of about 10 carbons or less, or a halogen, and $R_2$ and $R_2'$ may independently be methylene or include an aryl linking group. In Formula 3, $R_3$ may be a conjugated diene group. In Formula 4, $R_4$ may be an unsaturated dienophile group.

At least one of the above and other features and advantages may also be realized by providing a process of patterning a material layer, the process including forming a hardmask layer using the composition according to an embodiment on the material layer, forming a radiation-sensitive imaging layer on the hardmask layer, patternwise exposing the imaging layer to radiation to form a pattern of radiation-exposed regions in the imaging layer, selectively removing portions of the imaging layer and the hardmask layer to expose portions of the material layer, and etching the portions of the material layer that are exposed through openings in the hardmask layer.

The process may further include forming a silicon-containing hardmask layer after forming a hardmask layer and before forming the imaging layer. The process may further include forming a bottom antireflective hardmask layer on the silicon-containing hardmask layer prior to forming the imaging layer.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0138418, filed on Dec. 29, 2006, in the Korean Intellectual Property Office, and entitled: "High Etch Resistant Hardmask Composition Having Antireflective Properties and Method for Forming Patterned Material Layer Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a crosslinker" may represent a single compound, e.g., an N-methoxymethyl-melamine resin, or multiple compounds in combination, e.g., N-methoxymethyl-melamine resin mixed with an N-butoxymethyl-melamine resin.

As used herein, molecular weights of polymeric materials are weight average molecular weights, unless otherwise indicated.

Embodiments may provide an aromatic ring-containing polymer and hardmask composition including one or more aromatic ring-containing polymers, in which the refractive index and absorbance of a hardmask formed therewith are optimized for processing an underlying layer, such that the hardmask provides antireflective properties that may help to ensure a satisfactory lithography process margin. The polymers may include aromatic rings in the backbone. The aromatic rings may provide the polymers with a strong absorption in short wavelength regions, e.g., at 157 nm, 193 nm, and/or 248 nm. The polymers may further include reactive groups capable of participating in cycloaddition reactions, e.g., Diels-Alder reactions.

A first embodiment provides an aromatic ring-containing polymer having a naphthalene backbone, represented by Formula 1:

(1)

In Formula 1, $R_1$ may be hydrogen, a hydroxyl, a halogen, or a hydrocarbon of about 10 carbons or less. The hydrocarbon of 10 carbons or less may include, e.g., a $C_1$-$C_{10}$ alkyl group, a $C_6$-$C_{10}$ aryl group, or an allyl group. $R_2$ may be methylene or may include an aryl linking group. The aryl linking group may be unsubstituted or substituted, and may be, e.g., $R_3$ may be a conjugated diene group, and $R_4$ may be an unsaturated dienophile group. The numbers represented by m and n may be, independently, integers from 1 to about 190.

A second embodiment provides an aromatic ring-containing polymer having a naphthalene backbone, represented by Formula 2:

$R_3$ may be a conjugated diene group; $R_4$ may be an unsaturated dienophile group; and the numbers represented by m and n may be, independently, integers from 1 to about 190. Additionally, in Formula 2, the number represented by l may be an integer from 1 to about 190. In Formula 2, the ratio l:n+m may be about 1:2 to about 4:2.

In Formulae 1 and 2, $R_3$ and $R_4$ may be reactive groups capable of participating in cycloaddition reactions, e.g., Diels-Alder reactions. $R_3$ may be a group containing a diene, such as, e.g., a 1,3-butadienyl group, a furanyl group, a cyclopentadienyl group, a cyclopentadienylmethyl group, a 1,6-cyclohexadienyl group, or a 1,6-cyclohexadienylmethyl group. $R_4$ may be a dienophile group, such as, e.g., a vinyl In Formula 2, $R_1$, $R_2$, $R_3$, and $R_4$ may be as described in connection with Formula 1, i.e., $R_1$ may be hydrogen, a hydroxyl, a halogen, or a hydrocarbon of about 10 carbons or less; the hydrocarbon of 10 carbons or less may include, e.g., a $C_1$-$C_{10}$ alkyl group, a $C_6$-$C_{10}$ aryl group, or an allyl group; $R_2$ may be methylene or may include an aryl linking group; the aryl linking group may be unsubstituted or substituted, and may be, e.g., group, a cyclopentenyl group, a cyclopentenylmethyl group, a cyclohexenyl group, or a cyclohexenylmethyl group. $R_3$ and $R_4$ may be selected such that a [4+2] cycloaddition reaction can take place between $R_3$ and $R_4$.

A third embodiment provides a hardmask composition that may include an organic solvent and at least one of the aromatic ring-containing polymers represented by Formulae 1 or 2. The aromatic ring-containing polymers may exhibit a strong absorption in the short wavelength region, e.g., 157 nm, 193 nm, and 248 nm. Further, cycloaddition reactions, e.g., Diels-Alder reactions, may occur between the diene groups $R_3$ and the dienophile groups $R_4$ of the aromatic ring-containing polymers, in order to cure the hardmask composition. Since the cycloaddition reactions may occur spontaneously at high temperatures, the polymer molecules may be effectively crosslinked without the use of a special catalyst.

Therefore, by allowing the catalyst to be omitted, the composition may avoid contamination with, e.g., acidic compounds.

In an implementation, the aromatic ring-containing polymers of Formulae 1 and/or 2 included in the composition preferably have a weight average molecular weight of about 1,000 to about 30,000. A weight average molecular weight of about 1,000 or more may provide the hardmask composition that includes the polymer(s) with good coatability. A weight average molecular weight of about 30,000 or less may help ensure that an edge bead removal (EBR) process applied to the hardmask composition including the polymer(s) can be performed smoothly.

In the polymer represented by Formula 2, the relative proportion of the polymer made up by the repeating unit corresponding to the fraction l (shown below), may affect the crosslinking density and the solubility of the polymer.

In an implementation, the value of l may be determined so as to facilitate EBR processing upon coating of the composition. For example, in the polymer represented by Formula 2, the ratio l:n+m may be about 1:2 to about 4:2.

The organic solvent may be any suitable solvent that sufficiently dissolves the aromatic ring-containing polymer, e.g., propylene glycol monomethyl ether acetate (PGMEA), propylene glycol monomethyl ether (PGME), cyclohexanone, ethyl lactate, etc.

About 1% to about 25% of the weight of the hardmask composition may be the aromatic ring-containing polymer(s) represented by Formulae 1 and/or 2, preferably about 3 to about 10% by weight. About 75% to about 99% of the weight of the hardmask composition may be the organic solvent. The relative proportions of the polymer(s) and the solvent set forth above may help ensure formation of a desired coating thickness, i.e., the composition may be applied with a thickness that can be accurately regulated.

In an implementation, the composition may include a crosslinker and/or a surfactant. If the hardmask composition includes the crosslinker, reactive sites distributed along the backbone chain of the polymer, e.g., where $R_1$ is a hydroxyl group, may be crosslinked with the crosslinker. Crosslinking may occur between the crosslinker and the reactive sites, e.g., hydroxyl groups, of the aromatic ring-containing polymer, which may enhance the curability of the hardmask composition. The crosslinker may include one or more of, e.g., an etherified amino resin, an N-methoxymethyl-melamine resin, an N-butoxymethyl-melamine resin, a methylated urea resin, a butylated urea resin, a glycoluril derivative, a 2,6-bis(hydroxymethyl)-p-cresol compound, or a bisepoxy compound. The hardmask composition may also exhibit film-forming characteristics, which may assist in the formation of a hardmask layer when the composition is applied using a conventional spin-coating technique.

A fourth embodiment provides an antireflective hardmask composition that may include a blend of an aromatic ring-containing polymer having conjugated dienes and an aromatic ring-containing polymer having dienophiles. For example, the composition may include an aromatic ring-containing polymer represented by Formula 3 and having conjugated diene groups, blended with an aromatic ring-containing polymer represented by Formula 4 and having dienophile groups:

In Formula 3, $R_1$, $R_2$, $R_3$, m, and n may be the same as $R_1$, $R_2$, $R_3$, m, and n, respectively, as defined in Formula 1. In Formula 4, $R_1'$, $R_2'$, $R_4$, m' and n' may be the same as $R_1$, $R_2$, $R_4$, m, and n, respectively, as defined in Formula 1. In the composition containing the polymers represented by Formulae 3 and 4, $R_1$ and $R_1'$ may be the same or different, $R_2$ and $R_2'$ may be the same or different, m and m' may the same or different, and n and n' may be the same or different. In an implementation, either or both of Formulae 3 and 4 may further include a hydroxynaphthalene group in the polymer backbone, in similar fashion to Formula 2. In the polymers represented by Formulae 1, 2, 3, and 4, the polymers may be random copolymers or block copolymers and, in the synthesis of the polymers, the groups $R_1$, $R_3$, and $R_4$ may be introduced prior to polymerization or following polymerization.

Figure 1A:
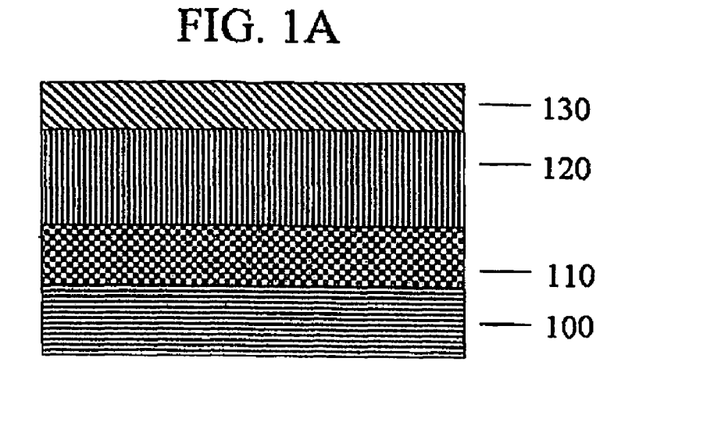
FIGS. 1A-1E illustrate stages in a method of fabricating a device using a hardmask composition according to an embodiment.
Figure 1B:
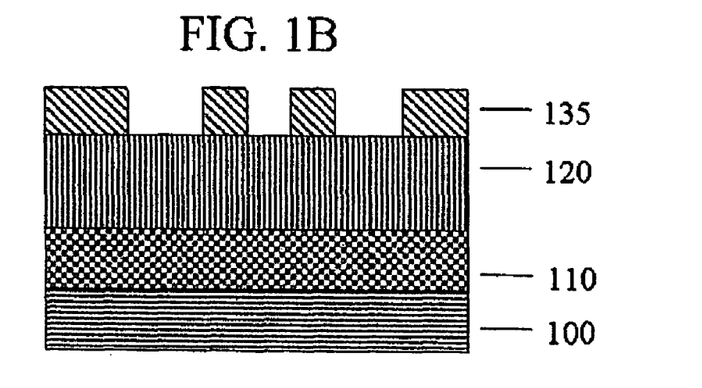
Figure 1C:
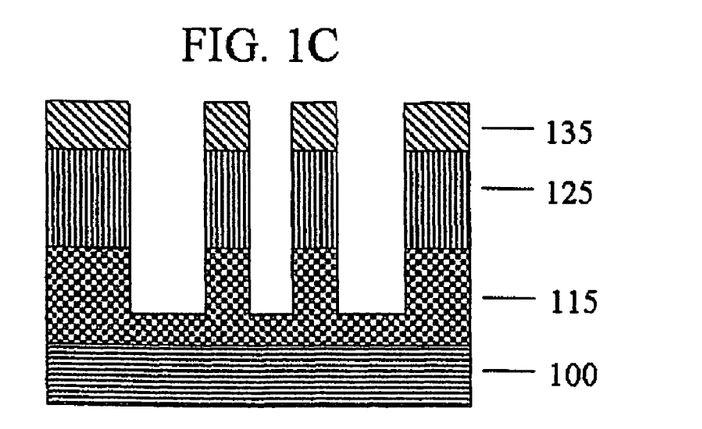

A fifth embodiment provides a process for patterning a material layer on a substrate using the hardmask composition according to an embodiment formed on the material layer. The process may include providing a material layer, e.g., a substrate having the material layer thereon, forming a hardmask layer using the composition according to an embodiment on the material layer, forming a radiation-sensitive imaging layer on the hardmask layer, patternwise exposing the imaging layer to radiation to form a pattern of radiation-exposed regions in the imaging layer, selectively removing portions of the imaging layer and the hardmask layer to expose portions of the material layer, and etching the portions of the material layer that are exposed through openings in the hardmask layer to pattern the material layer. For example, referring to FIG. 1A, the process of fabricating a device using a hardmask composition according to an embodiment may include providing a substrate 100 having a target material layer 110, e.g., a metal layer such as aluminum, or a silicon nitride (SiN) layer, forming a hardmask layer 120 on the target material layer 110, and forming an imaging layer 130, e.g., a photoresist layer, on the hardmask layer 120. Referring to FIGS. 1B and 1C, the imaging layer 130 may then be exposed and developed to yield a patterned imaging layer 135, after which the hardmask layer 120 and the target material layer 110 may be sequentially processed to form a hardmask pattern 125 and a patterned material layer 115.

As a particular example, the process may be carried out in accordance with the following procedure. First, a material to be patterned may be applied to a substrate, e.g., a silicon substrate, by a general technique. The material to be patterned may be an electrically conductive, semi-conductive, magnetic, or insulating material, e.g., aluminum, silicon nitride, etc. Thereafter, the hardmask composition according to an embodiment may be spin-coated, e.g., to a thickness of about 500 Å to about 4,000 Å, and baked to form a hardmask layer, e.g., baked at about 100° C. to about 300° C. for about 10 seconds to about 10 minutes. The radiation-sensitive imaging layer may then be formed on the hardmask layer. Exposure and developing of the imaging layer may then be conducted to form openings corresponding to where a pattern is to be formed, i.e., the imaging layer and the hardmask layer may be selectively removed to expose portions of the material layer. The material layer may then be etched, e.g., using dry etching with an etching gas such as a mixed gas of $CHF_3/CF_4$, to form a patterned material layer, with the hardmask serving to protect unexposed portions of the material layer. Thereafter, the remaining portions of the resist may be removed using a common photoresist stripper. The patterned hardmask, i.e., the polymerized composition including one or more cross-linked polymers according to an embodiment, may be removed. A semiconductor integrated circuit device, an optical or electro-optical device, a microelectromechanical (MEMS) device, etc., may thus be provided.

Figure 1D:
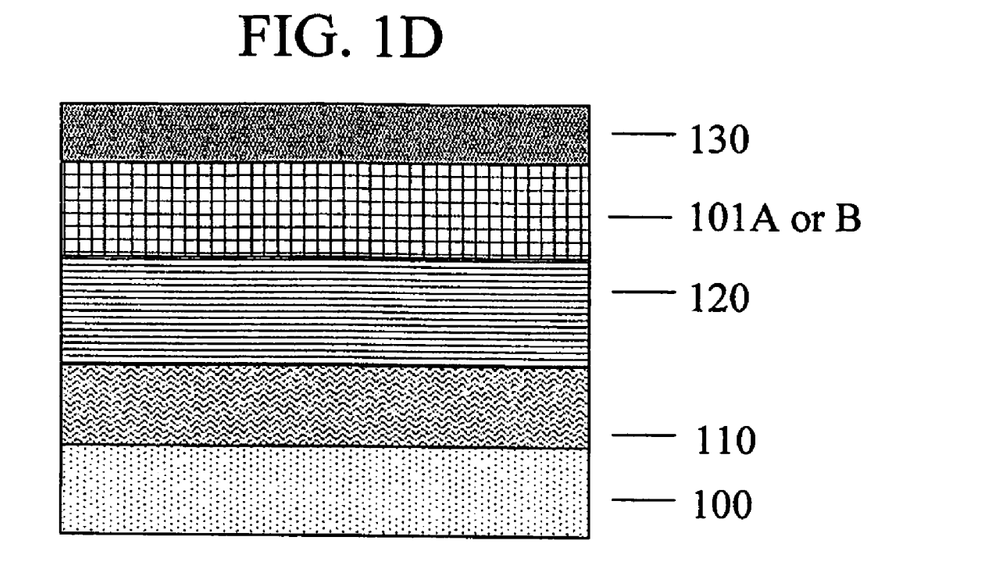
Figure 1E:
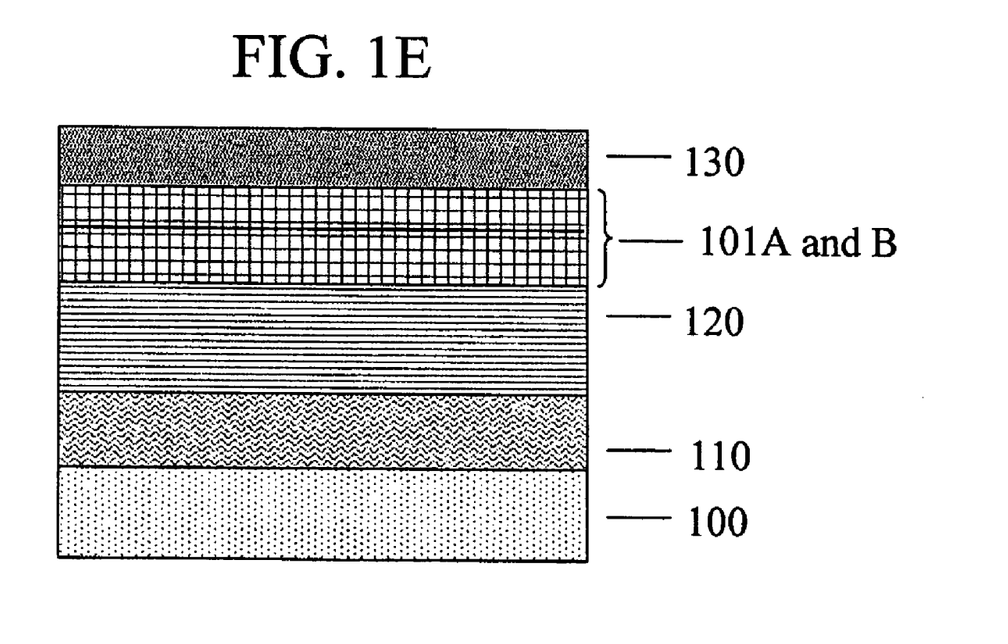

Referring to FIG. 1D, in an implementation, the process may further include forming a silicon-containing hardmask layer 101A or a bottom antireflective hardmask layer (BARC) 101B prior to forming the imaging layer 130, e.g., after forming the hardmask layer 120 according to an embodiment, and prior to forming the imaging layer 130. Referring to FIG. 1E, in an implementation, the bottom antireflective hardmask layer 101B may be formed on the silicon-containing hardmask layer 101A prior to forming the imaging layer 130, e.g., after forming the hardmask layer 120 according to an embodiment, and prior to forming the imaging layer 130.

The hardmask composition and the lithographic structure formed using the composition may be used in the fabrication and design of integrated circuit devices in accordance with general semiconductor manufacturing processes. For example, the composition may be used in the formation of patterned material layer structures such as metal wiring, holes for contacts and biases, insulating sections such as damascene trenches and shallow trench isolation (STI) structures, trenches for capacitor structures, etc.

The following Examples and Comparative Examples are provided in order to set forth particular details of one or more embodiments. However, it will be understood that the embodiments are not limited to the particular details described.

EXAMPLES

Synthesis Example 1

222.8 g (1.0 mol) of 4-cyclopentadienylmethyl-1-naphthol, 224.3 g (1.0 mol) of 4-cyclopentenylmethyl-1-naphthol, and 6.8 g (0.04 mol) of p-toluenesulfonic acid were dissolved in 350 g of propylene glycol monomethyl ether acetate (PGMEA) in a 2 L four-neck flask, which was equipped with a mechanical agitator, a condenser and a 300 ml dropping funnel. The flask was immersed and heated in an oil bath with magnetic stirring. When the internal temperature of the reaction solution reached 100° C., 60.6 g (2.0 mol) of paraformaldehyde was slowly added dropwise to the reaction solution through the dropping funnel for one hour. The mixture was allowed to react for 12 hours. Thereafter, the reactor was cooled to room temperature, and 5.9 g (0.04 mol) of trietha-nolamine as a neutralizing agent was added to the reaction mixture to quench the reaction. After completion of the reaction, the acid was removed from the reaction mixture using a mixture of water and methanol, and low-molecular weight compounds, e.g., oligomers and monomers, were removed using methanol, yielding a polymer represented by Formula 5. The molecular weight and the polydispersity of the polymer were measured by gel permeation chromatography (GPC) in tetrahydrofuran, and were determined to be $M_w=10,000$, polydispersity=2.1, and m+n=21:

(5)

Synthesis Example 2

The procedure of Synthesis Example 1 was repeated, except that 196.2 g (1.0 mol) of 4-buta-1,3-dienyl-1-naphthol and 170.2 g (1.0 mol) of 4-vinyl-1-naphthol were used instead of 222.8 g (1.0 mol) of 4-cyclopentadienylmethyl-1-naphthol and 224.3 g (1.0 mol) of 4-cyclopentenylmethyl-1-naphthol, respectively, to yield a polymer represented by Formula 6. The molecular weight and the polydispersity of the polymer were measured by gel permeation chromatography (GPC) in tetrahydrofuran, and were determined to be $M_w=11,000$ and a polydispersity=2.1:

(6)

Synthesis Example 3

222.8 g (1.0 mol) of 4-cyclopentadienylmethyl-1-naphthol, 224.3 g (1.0 mol) of 4-cyclopentenylmethyl-1-naphthol, 288.4 g (2 mol) of 1-naphthol, and 13.6 g (0.08 mol) of p-toluenesulfonic acid were dissolved in 700 g of propylene glycol monomethyl ether acetate (PGMEA) in a 2 L four-neck flask, which was equipped with a mechanical agitator, a condenser and a 300 ml dropping funnel. The flask was immersed and heated in an oil bath with magnetic stirring. When the internal temperature of the reaction solution reached 100° C., 121.2 g (4.0 mol) of paraformaldehyde was slowly added dropwise to the reaction solution through the dropping funnel for one hour. The mixture was allowed to react for 15 hours, and was then cooled to room temperature. 11.8 g (0.08 mol) of triethanolamine as a neutralizing agent was added to the reaction mixture to quench the reaction. After completion of the reaction, acid was removed from the reaction mixture using a mixture of water and methanol, and low-molecular weight compounds, e.g., oligomers and monomers, were removed using methanol, yielding a polymer represented by Formula 7. The molecular weight and the polydispersity of the polymer were measured by gel permeation chromatography (GPC) in tetrahydrofuran, and were determined to be $M_w$=10,000, polydispersity=1.9, l+m+n=21, and n+m:l=2:1:

Examples 1 through 3

In Examples 1 through 3, 0.8 g of each of the polymers prepared in Synthesis Examples 1 through 3 was dissolved in 9 g of propylene glycol monomethyl ether acetate (PGMEA), and filtered to prepare a sample solution. The sample solution was spin-coated on a silicon wafer, followed by baking at 200° C. for 60 seconds to form a 1,500 Å thick film. The refractive index (n) and extinction coefficient (k) of the respective films were measured using an ellipsometer (J. A. Woollam Co., Inc. (U.S.A.)). The results are shown in Table 1.

(7)

Synthesis Example 4

350.41 g (1.0 mol) of 9,9-bis(hydroxyphenyl)fluorene, 3.08 g (0.02 mol) of diethyl sulfate and 350 g of propylene glycol monomethyl ether acetate were completely dissolved with stirring in a reactor, while maintaining the temperature of the reactor at 115° C. 10 minutes after the dissolution, 116.35 g (0.7 mol) of 1,4-bis(methoxymethyl)benzene was added dropwise to the solution, and then the resulting mixture was allowed to react at the same temperature for 15 hours. 2.98 g (0.02 mol) of triethanolamine as a neutralizing agent was added to the reaction mixture to quench the reaction. After completion of the reaction, acid was removed from the reaction mixture using a mixture of water and methanol, and low-molecular weight compounds, e.g., oligomers and monomers, were removed using methanol, yielding a polymer represented by Formula 8. The molecular weight and the polydispersity of the polymer were measured by gel permeation chromatography (GPC) in tetrahydrofuran, and were determined to be $M_w$=10,000, polydispersity=2.0, and n=20:

Comparative Example 1

A film was formed in the same manner as in Examples 1 to 3, except that the polymer prepared in Synthesis Example 4 was used. The film was measured for refractive index (n) and extinction coefficient (k). The results are also shown in Table 1.

Referring to Table 1, the films formed in Examples 1 through 3 and Comparative Example 1 each had a refractive index and an absorbance suitable for use as antireflective films at wavelengths of 193 nm (ArF) and 248 nm (KrF).

TABLE 1

| | Optical properties (193 nm) | | Optical properties (248 nm) | |
|---|---|---|---|---|
| | Refractive index (n) | Extinction coefficient (k) | Refractive index (n) | Extinction coefficient (k) |
| Example 1 | 1.45 | 0.62 | 1.92 | 0.20 |
| Example 2 | 1.40 | 0.61 | 2.11 | 0.31 |
| Example 3 | 1.42 | 0.70 | 1.80 | 0.24 |
| Comparative Example 1 | 1.45 | 0.73 | 1.95 | 0.29 |

Examples 4 through 6

In Examples 4 through 6, each of the sample solutions prepared in Examples 1 through 3, respectively, was spin-coated on a silicon wafer covered with silicon nitride, and then baked at 200° C. for 60 seconds to form a 1,500 Å thick film. Thereafter, an ArF photoresist was coated on the film, baked at 110° C. for 60 seconds, exposed to light using an ArF exposure system (ASML1250, FN70 5.0 active, NA 0.82 (ASML Netherlands B.V.)), and developed with an aqueous solution of TMAH (2.38 wt %) to form an 80 nm line and (8)

space pattern. The patterns were measured for exposure latitude (EL) margin as a function of exposure energy, and depth of focus (DoF) margin as a function of the distance from a light source. The results are shown in Table 2.

Comparative Example 2

A patterned specimen was formed in the same manner as in Examples 4 through 6, except that the sample solution prepared in Comparative Example 1 was used. The profile of the pattern was observed. The pattern was measured for exposure latitude (EL) and depth of focus (DoF). The results are also shown in Table 2.

Referring to Table 2, there were no significant differences in profile and margins between the patterns formed in Examples 4 through 6 and the pattern formed in Comparative Example 2.

TABLE 2

| | Pattern properties | | |
|---|---|---|---|
| | EL margin (Δ mJ/exposure energy mJ) | DoF margin (μm) | Profile |
| Example 4 | 4 | 0.25 | cubic |
| Example 5 | 4 | 0.25 | cubic |
| Example 6 | 4 | 0.25 | cubic |
| Comparative Example 2 | 4 | 0.25 | cubic |

Examples 7 through 9

In Examples 7 though 9, the patterned specimens of Examples 4 through 6, respectively, were dry-etched using a first mixed gas of $CHF_3/CF_4$, and dry-etched using a second mixed gas of $CHF_3/CF_4$. The first mixed gas had an etch selectivity different from that of the first mixed gas. Finally, all remaining organic materials were removed using $O_2$, and the cross sections of the specimens were observed using a field emission scanning electron microscope (FE-SEM). The results are shown in Table 3.

Referring to Table 3, the etched patterns of Examples 7 through 9 all showed good profiles, which is believed to be because the hardmasks were highly resistant to the etching gas.

Comparative Example 3

The specimen formed in Comparative Example 2 was etched in accordance with the procedure described in Examples 7 to 9 to form a pattern. The pattern was observed and the results are also shown in Table 3.

Referring to Table 3, the pattern formed in Comparative Example 3 showed an isotropic (bowed) etching profile after etching of the hardmask. The isotropic etching profile is believed to cause tapering of the pattern upon etching of the silicon nitride.

TABLE 3

| Sample used in the formation of film | Pattern shape after etching of hardmask | Pattern shape after etching of silicon nitride |
|---|---|---|
| Example 7 | Vertical (Anisotropic) | Vertical (Anisotropic) |
| Example 8 | Vertical (Anisotropic) | Vertical (Anisotropic) |
| Example 9 | Vertical (Anisotropic) | Vertical (Anisotropic) |
| Comparative Example 3 | Bowed | Tapered |

The polymer and hardmask composition according to embodiments may be used in lithography, and may provide excellent optical and mechanical properties. As described above, the hardmask composition may be used to form a film having a refractive index and an absorbance suitable for use as an antireflective film in the deep UV (DUV) region, e.g., 193 nm (ArF) and/or 248 nm (KrF), and may significantly reduce reflectivity between a resist and an underlying layer. The hardmask composition may be used to provide a lithographic structure with good pattern profiles and process margins. The composition according to an embodiment may be highly resistant to dry etching, may exhibit high etch selectivity, may be resistant to multiple etching operations during lithography, and may be used to form a hardmask having a very good etch profile. Therefore, the composition may be used to provide a multilayer thin film that is patterned with high aspect ratio, and a good image may be transferred to an underlying layer. In addition, the composition may be readily applied by spin-on application techniques, and the composition may have little or no acid contaminants.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A naphthalene-backbone polymer represented by Formula 1:

wherein:
n and m are independently at least 1 and less than about 190,
$R_1$ is a hydrogen, a hydroxyl, a hydrocarbon group of about 10 carbons or less, or a halogen,
$R_2$ is methylene or includes an aryl linking group,
$R_3$ is a conjugated diene group, and
$R_4$ is an unsaturated dienophile group.

2. The polymer as claimed in claim 1, wherein:
$R_1$ is the hydrocarbon of about 10 carbons or less, and
the hydrocarbon of about 10 carbons or less includes a $C_1$-$C_{10}$ alkyl group, a $C_6$-$C_{10}$ aryl group, or an allyl group.

3. The polymer as claimed in claim 1, wherein $R_2$ is:

-continued

$R_2$ is unsubstituted or substituted.

4. The polymer as claimed in claim 1, wherein $R_3$ is a 1,3-butadienyl group, a furanyl group, a cyclopentadienyl group, a cyclopentadienylmethyl group, a 1,6-cyclohexadienyl group, or a 1,6-cyclohexadienylmethyl group.

5. The polymer as claimed in claim 4, wherein $R_4$ is a vinyl group, a cyclopentenyl group, a cyclopentenylmethyl group, a cyclohexenyl group, or a cyclohexenylmethyl group.

6. The polymer as claimed in claim 1, wherein the polymer has a weight average molecular weight of about 1,000 to about 30,000.

7. The polymer as claimed in claim 1, further comprising a hydroxynaphthalene group in the backbone, the polymer being represented by Formula 2:

wherein l is at least 1 and less than about 190.

8. The polymer as claimed in claim 7, wherein, in Formula 2, the ratio l:n+m is about 1:2 to about 4:2.

9. The polymer as claimed in claim 8, wherein the polymer has a weight average molecular weight of about 1,000 to about 30,000.

10. An antireflective hardmask composition, comprising:
an organic solvent; and
a naphthalene-backbone polymer represented by Formula 1:

wherein:
n and m are independently at least 1 and less than about 190, $R_1$ is a hydrogen, a hydroxyl, a hydrocarbon group of about 10 carbons or less, or a halogen,
$R_2$ is methylene or includes an aryl linking group,
$R_3$ is a conjugated diene group, and
$R_4$ is an unsaturated dienophile group.

11. The composition as claimed in claim 10, wherein:
about 1% to about 25% of the weight of the composition is the polymer represented by Formula 1, and
about 75% to 99% of the weight of the composition is the organic solvent.

12. The composition as claimed in claim 10, wherein:
$R_1$ is the hydrocarbon of about 10 carbons or less, and
the hydrocarbon of about 10 carbons or less includes a $C_1$-$C_{10}$ alkyl group, a $C_6$-$C_{10}$ aryl group, or an allyl group.

13. The composition as claimed in claim 10, wherein $R_2$ is:

-continued $R_2$ is unsubstituted or substituted.

14. The composition as claimed in claim 10, wherein $R_3$ is a 1,3-butadienyl group, a furanyl group, a cyclopentadienyl group, a cyclopentadienylmethyl group, a 1,6-cyclohexadienyl group, or a 1,6-cyclohexadienylmethyl group.

15. The composition as claimed in claim 14, wherein $R_4$ is a vinyl group, a cyclopentenyl group, a cyclopentenylmethyl group, a cyclohexenyl group, or a cyclohexenylmethyl group.

16. The composition as claimed in claim 10, wherein the polymer represented by Formula 1 has a weight average molecular weight of about 1,000 to about 30,000.

17. The composition as claimed in claim 10, wherein:
the naphthalene-backbone polymer further includes a hydroxynaphthalene group in the backbone, such that the naphthalene-backbone polymer is represented by Formula 2:

(2)

wherein l is at least 1 and less than about 190.

18. The composition as claimed in claim 17, wherein, in Formula 2, the ratio l:n+m is about 1:2 to about 4:2.

19. The composition as claimed in claim 10, further comprising a crosslinker.

20. An antireflective hardmask composition, comprising:
an organic solvent;
a first naphthalene-backbone polymer represented by Formula 3:

(3)

a second naphthalene-backbone polymer represented by Formula 4:

(4)

wherein:
in Formulae 3 and 4, n, m, n' and m' are independently at least 1 and less than about 190,
in Formulae 3 and 4, $R_1$ and $R_1'$ are independently a hydrogen, a hydroxyl, a hydrocarbon group of about 10 carbons or less, or a halogen,
in Formulae 3 and 4, $R_2$ and $R_2'$ are independently methylene or include an aryl linking group,
in Formula 3, $R_3$ is a conjugated diene group, and
in Formula 4, $R_4$ is an unsaturated dienophile group.

21. A process of patterning a material layer, the process comprising:
forming a hardmask layer using the composition according to claim 10 on the material layer;
forming a radiation-sensitive imaging layer on the hardmask layer;
patternwise exposing the imaging layer to radiation to form a pattern of radiation-exposed regions in the imaging layer;
selectively removing portions of the imaging layer and the hardmask layer to expose portions of the material layer; and
etching the portions of the material layer that are exposed through openings in the hardmask layer.

22. The process as claimed in claim 21, further comprising forming a silicon-containing hardmask layer after forming a hardmask layer and before forming the imaging layer.

23. The process as claimed in claim 22, further comprising forming a bottom antireflective hardmask layer on the silicon-containing hardmask layer prior to forming the imaging layer.

24. A process of patterning a material layer, the process comprising:
forming a hardmask layer using the composition according to claim 20 on the material layer;
forming a radiation-sensitive imaging layer on the hardmask layer;
patternwise exposing the imaging layer to radiation to form a pattern of radiation-exposed regions in the imaging layer;
selectively removing portions of the imaging layer and the hardmask layer to expose portions of the material layer; and
etching the portions of the material layer that are exposed through openings in the hardmask layer.

* * * * *